(12) United States Patent
Hong et al.

(10) Patent No.: US 7,126,865 B2
(45) Date of Patent: Oct. 24, 2006

(54) MEMORY DEVICE INCLUDING PARALLEL TEST CIRCUIT

(75) Inventors: Yun Seok Hong, Gyeonggi-do (KR); Shin Ho Chu, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 132 days.

(21) Appl. No.: 10/879,175

(22) Filed: Jun. 30, 2004

(65) Prior Publication Data

US 2005/0195666 A1 Sep. 8, 2005

(30) Foreign Application Priority Data

Mar. 6, 2004 (KR) .................. 10-2004-0015259

(51) Int. Cl.
*G11C 7/00* (2006.01)
*G11C 8/00* (2006.01)

(52) U.S. Cl. ..................... 365/201; 365/233
(58) Field of Classification Search ............... 365/201, 365/189.12, 230.03, 233
See application file for complete search history.

(56) References Cited

U.S. PATENT DOCUMENTS 6,381,715 B1 * 4/2002 Bauman et al. ............. 365/201
6,529,428 B1 * 3/2003 Oh ............................ 365/201
6,606,274 B1 * 8/2003 Ooishi et al. ............... 365/201
6,917,563 B1 * 7/2005 Lindstedt et al. ....... 365/189.12

FOREIGN PATENT DOCUMENTS

KR  10-1996-0037470  9/1999

* cited by examiner

Primary Examiner—Trong Phan
(74) Attorney, Agent, or Firm—Heller Ehrman LLP

(57) ABSTRACT

A memory device including a parallel test circuit can overcome a channel deficiency phenomenon of test equipment by reducing the number of input/output pads. The memory device including a parallel test circuit comprises a burst length regulating block, a parallel test block, an output block and a plurality of input/output pads. The burst length regulating block sets a second burst length at a test mode which is longer than a first burst length at a normal mode. The parallel test block compresses data and tests the compressed data by a repair unit. The output block sequentially outputs data outputted from at least two or more parallel test blocks depending on the second burst length. The plurality of input/output pads externally output data outputted from the output block.

5 Claims, 4 Drawing Sheets

MEMORY DEVICE INCLUDING PARALLEL TEST CIRCUIT

BACKGROUND OF THE INVENTION

1. Field of the Invention

The present invention generally relates to a memory device including a parallel test circuit, and more specifically, to a memory device including a parallel test circuit which overcomes a channel deficiency phenomenon of test equipment by reducing the number of input/output pads.

2. Description of the Prior Art

In general, data should exactly be read or written in a semiconductor memory device such as a dynamic RAM. For the exact read/write operation, even one defective cell should not exist on a chip. However, as the number of cells integrated in one chip increases more and more due to high integration of the semiconductor memory device, the number of defective cells may also increase in spite of improvement of the manufacture process. If the exact test is not performed on these defective cells, the reliability of the semiconductor memory device cannot be secured.

Although it is important to perform a reliable test on devices, a high speed test can also be performed on a great number of cells. Specifically, since reduction of improvement period and test time of a semiconductor memory device directly affects cost of products, the reduction of test time has been the main issue manufacture companies.

When one cell is tested to distinguish pass or fail of cells in a memory chip of a semiconductor memory device, the test of the highly integrated memory device takes much time and causes increase of cost.

As a result, a parallel test mode is used to reduce the test time.

When the same data are read after the same data are written in a plurality of cells, the parallel test determined pass or fail of the cells with an exclusive OR logic circuit. The value of the logic operation is "1" to determine pass of the cells if the same data are read, and the value of the logic operation is "0" to determine fail of the cells if the different data are read, thereby reducing the test time.

FIG. 1 is a diagram illustrating a parallel test structure of a conventional memory device. Here, a parallel test of a 4×32 DRAM is exemplified.

Referring to FIG. 1, since the fail cells are repaired in a half bank unit HALF0-A, HALF0-B, HALF1-A, HALF1-B, HALF2-A, HALF2-B, HALF3-A, and HALF3-B, a parallel test block 1 compresses data of half banks HALF0-A, HALF0-B, HALF1-A, HALF1-B, HALF2-A, HALF2-B, HALF3-A, and HALF3-B at a parallel test mode, and outputs the compressed data to input/output pads DQ0, DQ1, DQ2, DQ3, DQ4, DQ5, DQ6, and DQ7. Here, the parallel test measures a lot of dies in one test equipment.

As a result, the large number of dies can be measured when four input/output pads DQ are used to reduce the number of channels in the test equipment than when 8 input/output pads DQ are used in the test equipment. However, since data compressed in one bank unit are outputted through four input/output pads DQ, the repair operation is required to be performed simultaneously in one bank unit, thereby reducing the efficiency of the repair operation.

SUMMARY OF THE INVENTION

It is an object of the present invention to maintain repair efficiency at a parallel test mode and to reduce the number of input/output pads DQ.

In an embodiment, a memory device including a parallel test circuit comprises a burst length regulating block, a parallel test block, an output block and a plurality of input/output pads. The burst length regulating block sets a second burst length at a test mode which is longer than a first burst length at a normal mode. The parallel test block compresses data by a repaired unit and tests the compressed data. The output block sequentially outputs data outputted from at least two or more parallel test blocks depending on the second burst length. The plurality of input/output pads externally output data outputted from the output block.

BRIEF DESCRIPTION OF THE DRAWINGS

Other aspects and advantages of the present invention will become apparent upon reading the following detailed description and upon reference to the drawings in which.

DETAILED DESCRIPTION OF THE PREFERRED EMBODIMENTS

The present invention will be described in detail with reference to the accompanying drawings.

Figure 1:
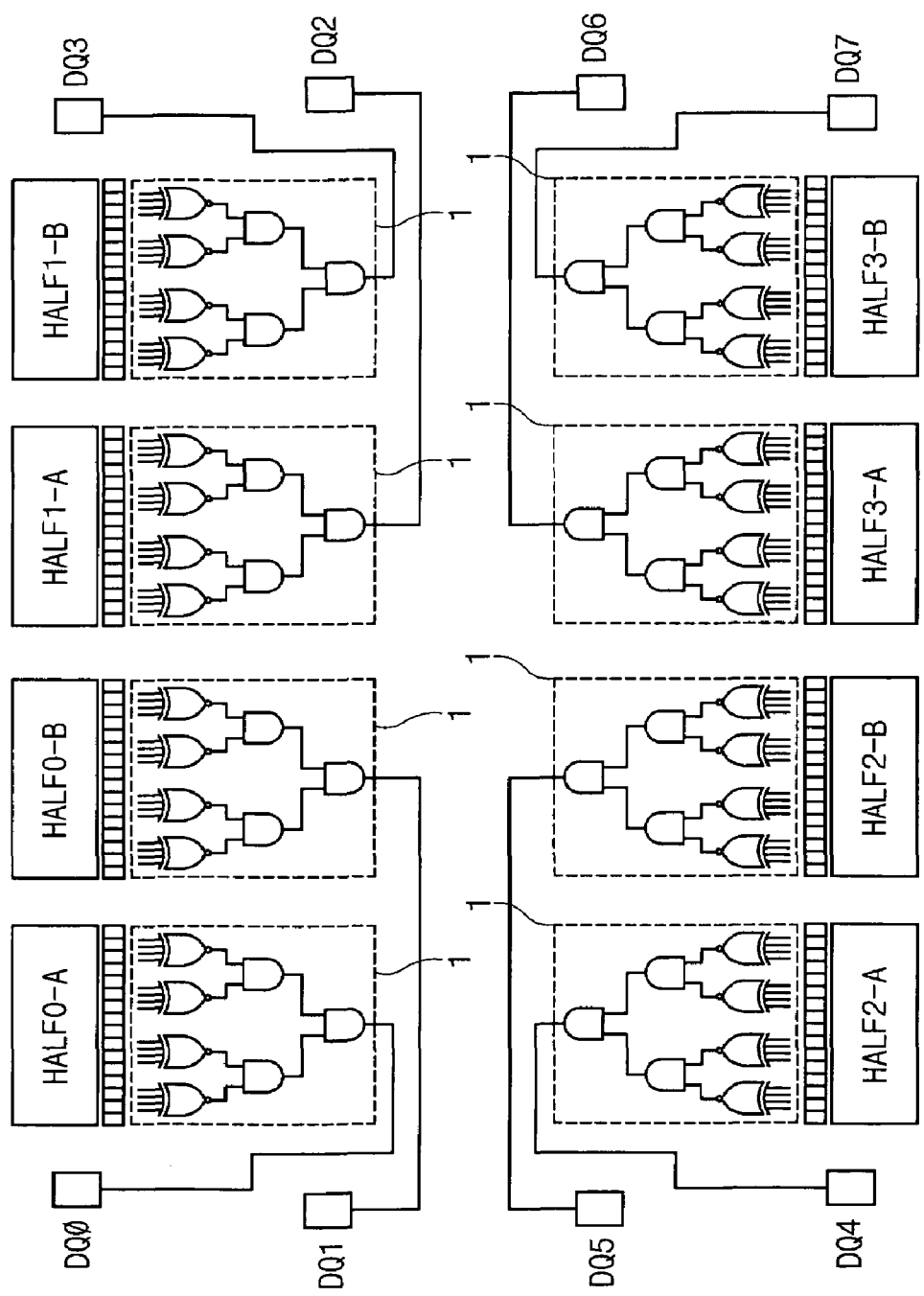
FIG. 1 is a diagram illustrating a parallel test structure of a conventional memory device.
Figure 2:
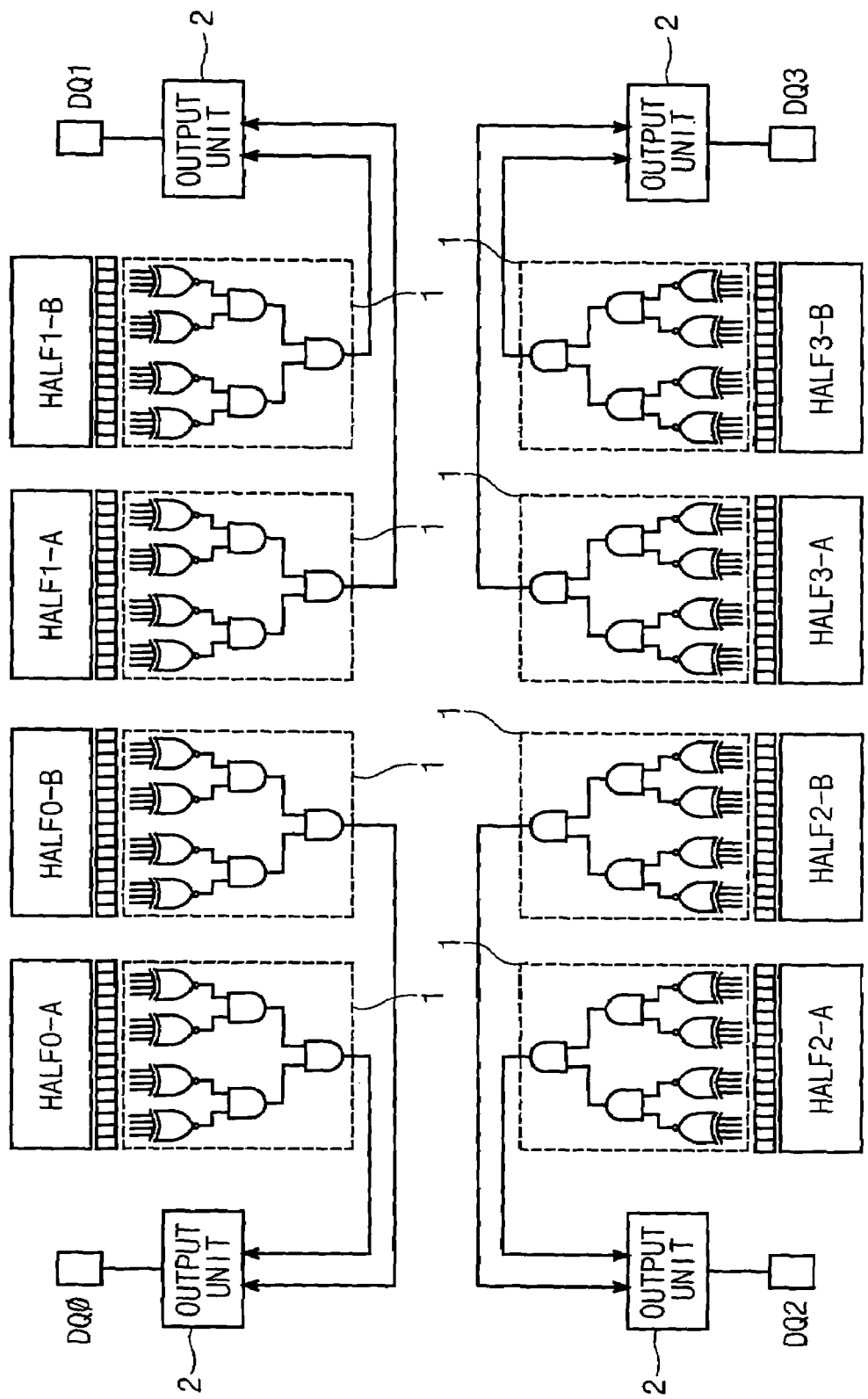
FIG. 2 is a diagram illustrating a parallel test structure of a memory device according to an embodiment of the present invention.

FIG. 2 is a diagram illustrating a parallel test structure of a memory device according to an embodiment of the present invention.

Referring to FIG. 2, since a repair operation is performed in a half bank unit at a parallel test mode, a parallel test block 1 compresses data of half banks HALF0-A, HALF0-B, HALF1-A, HALF1-B, HALF2-A, HALF2-B, HALF3-A, and HALF3-B, and outputs the compressed data. Here, two data outputted from one bank, that is, a pair of half banks HALF0-A and HALF0-B are sequentially outputted through one input/output pad DQ0. Here, an output unit 2 having a pipe latch scheme sequentially outputs two data outputted from one bank to the input/output pads DQ0, DQ1, DQ2, and DQ3.

Here, a burst length (hereinafter, referred to as "BL") twice longer than a BL at a normal mode is required to be set at the parallel test mode.

As a result, since one bank, that is a pair of half banks, can be tested through one input/output pad DQ, the number of input/output pads DQ can be reduced without reducing the repair efficiency. Therefore, the number of dies which the test equipment can test simultaneously can be increased.

Meanwhile, if the structure according to an embodiment of the present invention is applied while the number of input/output pads DQ used at the test mode is maintained, the repair efficiency can be increased twice. That is, the repair operation can be performed in a quarter bank unit.

Figure 3:
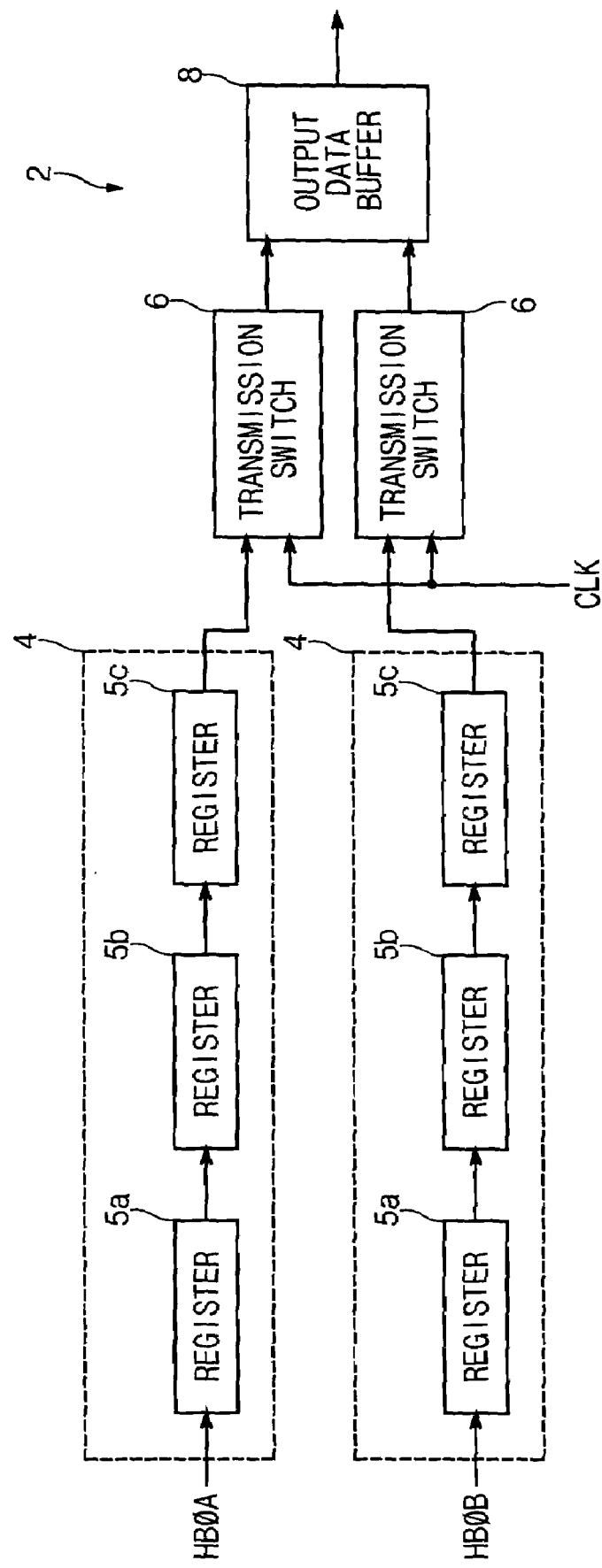
FIG. 3 is a block diagram illustrating an output unit of FIG. 2.

FIG. 3 is a block diagram illustrating the output unit 2 of FIG. 2. Here, the output unit 2 has a pipe latch scheme.

The output unit 2 comprises two register chains 4, two transmission switches 6 and an data output buffer 8.

The register chain 4 comprises a plurality of registers 5a, 5b, and 5c connected serially. One data HB0A of half banks HALF-A is inputted in one first register 5a of the two register chains, and the other data HB0B of HALF-B is inputted in the other first register 5a.

The transmission switch 6 sequentially transmits data from the final register 5c to an data output buffer 8. That is, data HB0A and HB0B are alternately transmitted at a rising edge of the clock signal CLK.

Figure 4:
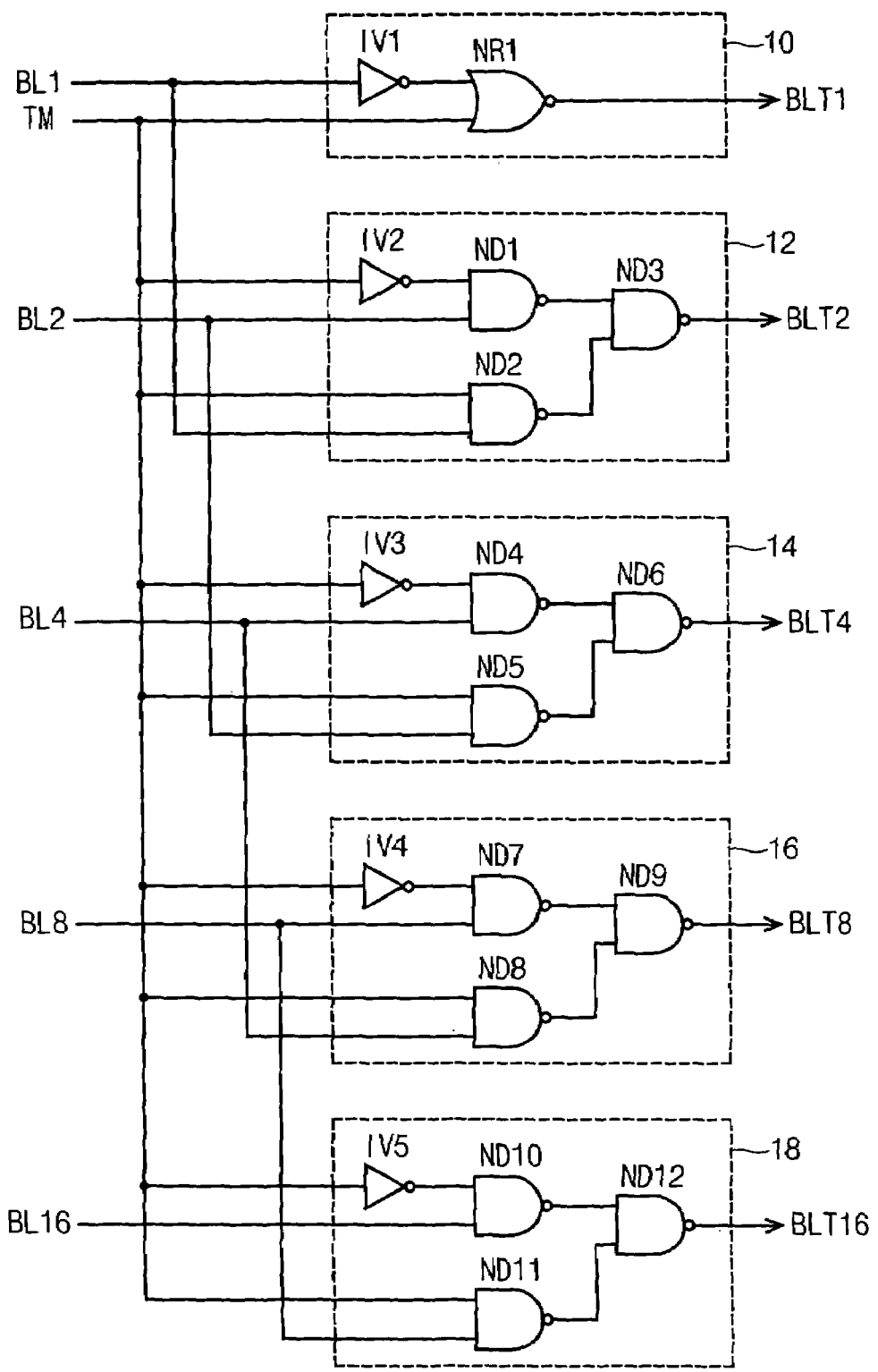
FIG. 4 is a block diagram illustrating a burst length regulating circuit.

FIG. 4 is a block diagram illustrating a burst length regulating circuit. Here, the BL regulating circuit regulates a BL at a test mode to be twice longer than a BL used at a normal mode.

A first BL regulating unit 10 comprises an inverter IV1 and a NOR gate NR1. The NOR gate NR1 performs a NOR operation on a test mode signal TM and a signal obtained by inverting a first normal BL control signal BL1 in the inverter IV1, and generates a first test BL control signal BLT1. Here, the first normal BL control signal BL1 sets a BL as "1" at the normal mode.

As a result, at the normal mode, if the first normal BL control signal BL1 is activated to a high level to set the BL as "1", the first test BL control signal BLT1 is activated to a high level to set the BL as "1". Since the test mode signal TM is activated to a high level at the test mode, the first test BL control signal BLT1 is inactivated to a low level regardless of the first normal BL control signal BL1.

A second BL regulating unit 12 comprises an inverter IV2, and NAND gates ND1~ND3. The first NAND gate ND1 performs a NAND operation on a second normal BL control signal BL2 for setting the BL as "2" at the normal mode and a signal obtained by inverting the test mode signal TM in the inverter IV2. The second NAND gate ND2 performs a NAND operation on the test mode signal TM and the first normal BL control signal BL1. The third NAND gate ND3 performs a NAND operation on output signals from the NAND gates ND1 and ND2, and generates a second test BL control signal BLT2.

As a result, at the normal mode, the first test BL control signal BLT1 is activated by the first BL regulating unit 10 to set the BL as "1" if the first normal BL control signal BL1 is activated, and the second test BL control signal BLT2 is activated to set the BL as "2" if the second normal BL control signal BL2.

At the test mode, if the first normal BL control signal BL1 is activated, the second test BL control signal BLT2 is activated to set the BL as "2".

A third BL regulating unit 14 comprises an inverter IV3, and NAND gates ND4~ND6. The fourth NAND gate ND4 performs a NAND operation on a third normal BL control signal BL4 for setting the BL as "4" at the normal mode and a signal obtained by inverting the test mode signal TM in the inverter IV3. The fifth NAND gate ND5 performs a NAND operation on the test mode signal TM and the second normal BL control signal BL2. The sixth NAND gate ND6 performs a NAND operation on output signals from the NAND gates ND4 and ND5, and generates a third test BL control signal BLT4.

As a result, at the normal mode, the second test BL control signal BLT2 is activated by the second BL regulating unit 12 to set the BL as "2" if the second normal BL control signal BL2 is activated, and the third test BL control signal BLT4 is activated to set the BL as "4" if the third normal BL control signal BL4 is activated.

At the test mode, if the second normal BL control signal BL2 is activated, the third test BL control signal BLT4 is activated to set the BL as "4".

A fourth BL regulating unit 16 comprises an inverter IV4, and NAND gates ND7~ND9. The seventh NAND gate ND7 performs a NAND operation on a fourth normal BL control signal BL8 for setting the BL as "8" at the normal mode and a signal obtained by inverting the test mode signal TM in the inverter IV4. The eighth NAND gate ND8 performs a NAND operation on the test mode signal TM and the third normal BL control signal BL4. The ninth NAND gate ND9 performs a NAND operation on output signals from the NAND gates ND7 and ND8, and generates a fourth test BL control signal BLT8.

As a result, at the normal mode, the third test BL control signal BLT4 is activated by the third BL regulating unit 16 to set the BL as "4" if the third normal BL control signal BL4 is activated, and the fourth test BL control signal BLT8 is activated to set the BL as "8" if the fourth normal BL control signal BL8.

At the test mode, if the third normal BL control signal BL4 is activated, the fourth test BL control signal BLT8 is activated to set the BL as "8".

A fifth BL regulating unit 18 comprises an inverter IV5, and NAND gates ND10~ND12. The tenth NAND gate ND10 performs a NAND operation on a fifth normal BL control signal BL16 for setting the BL of the normal mode as "16" and a signal obtained by inverting the test mode signal TM in the inverter IV5. The eleventh NAND gate ND11 performs a NAND operation on the test mode signal TM and the fourth normal BL control signal BL8. The twelfth NAND gate ND12 performs a NAND operation on output signals from the NAND gates ND10 and ND11, and generates a fifth test BL control signal BLT16.

As a result, at the normal mode, the fourth test BL control signal BLT2 is activated by the fourth BL regulating unit 16 to set the BL as "8" if the fourth normal BL control signal BL8 is activated, and the fifth test BL control signal BLT16 is activated to set the BL as "16" if the fifth normal BL control signal BL16.

At the test mode, if the fourth normal BL control signal BL8 is activated, the fifth test BL control signal BLT16 is activated to set the BL as "16".

As discussed earlier, in a memory device including a parallel test circuit according to an embodiment of the present invention, since the number of channels in each die of the test equipment can be reduced, the test time is also reduced.

Additionally, the repair efficiency can be increased when the number of input/output pads is maintained at a parallel test mode.

While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A memory device including a parallel test circuit, comprising:
   a burst length regulating block for setting a second burst length at a test mode which is longer than a first burst length at a normal mode;
   a parallel test block for compressing data and testing the compressed data by a repair unit;
   an output block for sequentially outputting data outputted from at least two or more parallel test blocks depending on the second burst length; and
   a plurality of input/output pads for externally outputting data outputted from the output block.

2. The memory device according to claim 1, wherein the burst length regulating block activates a second burst length control signal for setting the second burst length and inactivates the first burst length control signal when a first burst length control signal for setting the first burst length is activated at the test mode.

3. The memory device according to claim 1, wherein the output block comprises:
   a plurality of storing units for storing data outputted from the parallel test block;
   a plurality of switch units for sequentially transmitting data outputted from the plurality of storing units; and
   an data output buffer for driving data outputted from the switch means and outputting the data to the input/output pad.

4. The memory device according to claim 3, wherein the storing unit has a pipe latch scheme.

5. The memory device according to claim 3, wherein the switch unit is selectively turned on in response to a clock.

* * * * *